(12) United States Patent
Cantwell et al.

(10) Patent No.: US 6,624,441 B2
(45) Date of Patent: Sep. 23, 2003

(54) HOMOEPITAXIAL LAYERS OF P-TYPE ZINC OXIDE AND THE FABRICATION THEREOF

(75) Inventors: Henry E. Cantwell, Miami, OK (US); David B. Eason, Miami, OK (US)

(73) Assignee: Eagle-Picher Technologies, LLC, Joplin, MO (US)

( * ) Notice: Subject to any disclaimer, the term of this patent is extended or adjusted under 35 U.S.C. 154(b) by 0 days.

(21) Appl. No.: 10/071,044

(22) Filed: Feb. 7, 2002

(65) Prior Publication Data

US 2003/0146433 A1 Aug. 7, 2003

(51) Int. Cl.[7] .................... H01L 29/12; H01L 33/00
(52) U.S. Cl. ................. 257/43; 257/103; 257/102; 257/79; 257/11
(58) Field of Search ............... 438/46, 483, 488, 438/93; 428/701; 156/614; 204/192.22, 192.25, 192.26, 198.16; 257/15, 103, 43, 79, 102, 11

(56) References Cited

U.S. PATENT DOCUMENTS

| | | | |
|---|---|---|---|
| 6,291,085 B1 | 9/2001 | White et al. | 428/642 |
| 6,342,313 B1 | 1/2002 | White et al. | 428/701 |
| 6,407,405 B1 * | 6/2002 | Sano et al. | 257/15 |
| 6,410,162 B1 * | 6/2002 | White et al. | 428/642 |

OTHER PUBLICATIONS

Tetsuya Yamamoto, Hiroshi Katayama–Yoshida, *Solution Using a Codoping Method to Unipolarity for the Fabrication of p–type ZnO*, Jpn. J. Appl. Phys., vol. 38 (1999), pp. L166–L169.

Matthew Joseph, Hitoshi Tabata, Tornoji Kawai, *P–type Electrical Conduction in ZnO Thin Films by Ga and N Codoping*, Jpn. J. Appl. Phys., vol. 38 (1999), pp. L1205–L1207.

Kazunori Minegishi, Jasushi Kaiwai, Yukinobu Kikuchi,, Kohi Yano, Masanobu Kasuga, Azuma Shimizu, *Growth of p–type Zinc Oxide Films by Chemical Vapor Deposition*, Jpn. J. Appl. Phys., vol. 36 (1997), L1453, Pt. 2, No. 11A.

* cited by examiner

Primary Examiner—Minh Loan Tran
Assistant Examiner—Tan Tran
(74) Attorney, Agent, or Firm—Wood, Herron & Evans, L.L.P.

(57) ABSTRACT

A semiconductor structure for providing an epitaxial zinc oxide layer having p-type conduction for semiconductor device manufacture and methods of depositing the p-type zinc oxide layer. A zinc oxide layer is deposited epitaxially by molecular beam epitaxy on a crystalline zinc oxide substrate. The zinc oxide layer incorporates a p-type dopant, such as nitrogen, in an atomic concentration adequate to provide p-type conduction. The p-type zinc oxide layer may further incorporate an atomic concentration of a compensating species, such as lithium, sufficient to electronically occupy excess donors therein so that the efficiency of the p-type dopant may be increased.

26 Claims, 2 Drawing Sheets

HOMOEPITAXIAL LAYERS OF P-TYPE ZINC OXIDE AND THE FABRICATION THEREOF

FIELD OF THE INVENTION

The invention relates to homoepitaxial layer formation in the fabrication of semiconductor devices and, more particularly, to p-type epitaxial zinc oxide layer formation on a zinc oxide substrate.

BACKGROUND OF THE INVENTION

Zinc oxide (ZnO) is a wide band gap semiconductor that is a promising material for the manufacture of radiation detecting devices (e.g., photoconductors, junction photodiodes, and avalanche photodiodes) operating in the ultraviolet, x-ray and gamma-ray regions of the electromagnetic spectrum and light emitting devices (e.g., light emitting diodes and laser diodes) operating in the ultraviolet and at blue wavelengths of the visible spectrum. Currently, radiation detecting and light emitting devices for these purposes are fabricated in an active layer of a compound semiconductor, typically gallium nitride (GaN), deposited heteroepitaxially on a single crystal substrate, such as sapphire. However, due to differences in lattice parameter and coefficient of thermal expansion, heteroepitaxy introduces a high density of dislocations that degrades the optical properties of the active layer material and leads to devices having an inferior performance. A buffer layer may be provided between the active layer and the substrate to alleviate the lattice mismatch. However, even the introduction of the buffer layer cannot prevent the introduction of a significant dislocation density into the active layer during deposition.

Zinc oxide has various advantages over GaN, in particular, for use as an active layer for fabricating radiation detecting devices and ultraviolet and blue light emitting devices. Among these advantages, ZnO has a significantly larger exciton binding energy than GaN, which suggests that ZnO-based lasers should have more efficient optical emission and detection. In addition, laser mirrors formed in GaN active layers on sapphire are more difficult and expensive to produce than ZnO-based lasers because the material is not cleavable. Furthermore, ZnO has a higher theoretical saturation velocity than GaN, potentially leading to faster device performance. Moreover, wafers of GaN, which would permit homoepitaxy of epitaxial GaN layers having a reduced defect density, are not commercially available at a reasonable price. Furthermore, because most common substrates, such as sapphire, used for heteroepitaxy of GaN active layers are electrically insulating, it is impossible to form backside ohmic contacts. Zinc oxide also has a better radiation-resistance than either gallium arsenide (GaAs) or GaN, which could find significance for radiation hardened electronics.

Molecular beam epitaxy (MBE) is a physical vapor deposition technique performed in ultra high vacuum in which a molecular beam of one or more constituent elements or compounds of interest is generated from pure elemental or compound material residing in a heated source, such as an effusion cell or Knudsen-type cell, and is directed toward an exposed surface of a heated substrate. The atoms or molecules comprising the molecular beam chemically combine at the surface of the substrate to form as a deposited epitaxial layer or thin film. Molecular beam epitaxy is particularly suitable for the deposition of high quality epilayers, heterojunctions, superlattices and multiple quantum wells on a single crystal substrate. In particular, epilayers deposited by MBE offer lowered defect densities than the substrate and more controlled doping compared to substrate doping.

A principle limitation to the use of active layers of ZnO for device fabrication has been the inability to produce reproducible, p-type conduction and, in particular, the inability to produce such p-type layers with techniques of MBE. Layers of p-type ZnO have been reported as successfully deposited heteroepitaxially on GaAs and sapphire substrates. However, devices formed in such active layers of p-type ZnO are deficient in their properties because of the significant differences in lattice parameter and coefficient of thermal expansion between the deposited layer and the substrate. For example, the lattice parameter of wurtzite ZnO along its c-axis is smaller than that of zincblende GaAs by about 9% and the thermal expansion coefficient of ZnO in a plane containing its a-axis is smaller than that of GaAs by about 26%. As a result, the heteroepitaxial deposition of ZnO on a substrate introduces a large lattice strain in the ZnO layer. This lattice strain precipitates lattice defects in the ZnO layer, which degrade the performance of devices formed in the ZnO layer and makes it difficult to manufacture practical ZnO-based light emitters and detectors by heteroepitaxy on such substrates. In addition, differences in coefficient of thermal expansion between the heteroepitaxial ZnO layer and the substrate cause thermal stresses that propagate dislocations, which ultimately results in dark lines or dead spots in degraded light emitting devices. As a result, radiation detecting devices and light emitting devices that incorporate active layers of p-type ZnO deposited heteroepitaxially on GaAs and sapphire substrates are generally of inferior quality and lack the stability to provide a usable device having a significant operational lifetime.

There is a need for a semiconductor structure having an epitaxial p-type ZnO layer of a reduced defect density for use in fabricating ZnO-based semiconductor devices and a method of forming such epitaxial p-type ZnO layers.

SUMMARY OF THE INVENTION

According to the present invention, a semiconductor structure is provided that includes an epitaxial p-type zinc oxide layer having an improved crystallinity. The semiconductor structure of the present invention is a single-crystal zinc oxide substrate having a surface and an epitaxial zinc oxide layer formed on the surface of the zinc oxide substrate. The zinc oxide layer includes an atomic concentration of a p-type dopant, such as nitrogen, sufficient to provide p-type conduction. In certain embodiments, the zinc oxide layer may include a compensating dopant or element, such as lithium, that electronically occupies excess donors present intrinsically in the zinc oxide layer. The compensating element enhances the effectiveness of the p-type dopant and, thereby, reduces the atomic concentration of the p-type dopant required to furnish the desired p-type dopant level.

The present invention further provides a method of fabricating a semiconductor device structure that includes providing a single-crystal zinc oxide substrate having a surface on which a zinc oxide layer is to be deposited and positioning the zinc oxide substrate in a molecular beam epitaxy system. A first flux containing zinc and a second flux containing oxygen atomic species, including radicals, neutrals, ions, and molecules, are formed in the molecular beam epitaxy system. The first and the second fluxes have relative magnitudes adequate to deposit zinc oxide. A third flux is formed in the molecular beam epitaxy system that contains atomic species of a p-type dopant present in an amount sufficient to provide p-type conduction in zinc oxide. The zinc oxide substrate is heated to a deposition temperature sufficient to promote crystalline deposition on the surface of the zinc oxide layer. Finally, the first, second and third fluxes are applied to the surface for a duration sufficient to epitaxially deposit thereon the layer of zinc oxide, doped with the p-type dopant in an atomic concentration sufficient to provide the layer with p-type conduction.

By virtue of the foregoing, there is provided an epitaxial p-type zinc oxide layer that eliminates the problems associated with the heteroepitaxial deposition of p-type zinc oxide on substrates, such as gallium arsenide, and that has a crystalline quality satisfactory for use as an active layer in a semiconductor device. The homoepitaxial deposition of the p-type zinc oxide layer on a single crystal zinc oxide substrate negates the introduction of stresses caused as a result of mismatch in the lattice constant and thermal expansion between the layer and the substrate. By doing so, the propagation of defects from the substrate into the p-type zinc oxide layer and through the p-type zinc oxide layer is lessened or prevented so as to significantly improve the crystalline quality of that layer.

The homoepitaxy of a p-type zinc oxide layer on a zinc oxide substrate has various other benefits. Among those benefits, zinc oxide has a relatively high exciton binding energy that pen-nits more efficient optical emission and detection, a higher (theoretical) saturation velocity to facilitate faster electronic devices, a commercially available native zinc oxide substrate for homoepitaxial deposition of thin films, and a lower cost for the basic materials used in fabrication. Zinc oxide also has a large photoconductivity and is an order of magnitude more radiation-resistant than most candidate semiconductor materials, including gallium nitride. Undoped zinc oxide substrates have n+-type conductivity, which facilitates the formation of backside ohmic contacts, to fabricate vertical device structures. The resultant ability to provide vertical device structures simplifies device fabrication and, in particular, significantly reduces the cost of fabricating radiation detecting devices and light emitting devices.

The objects and advantages of the present invention will be further appreciated in light of the following detailed description and drawings in which:

BRIEF DESCRIPTION

DETAILED DESCRIPTION

Figure 1:
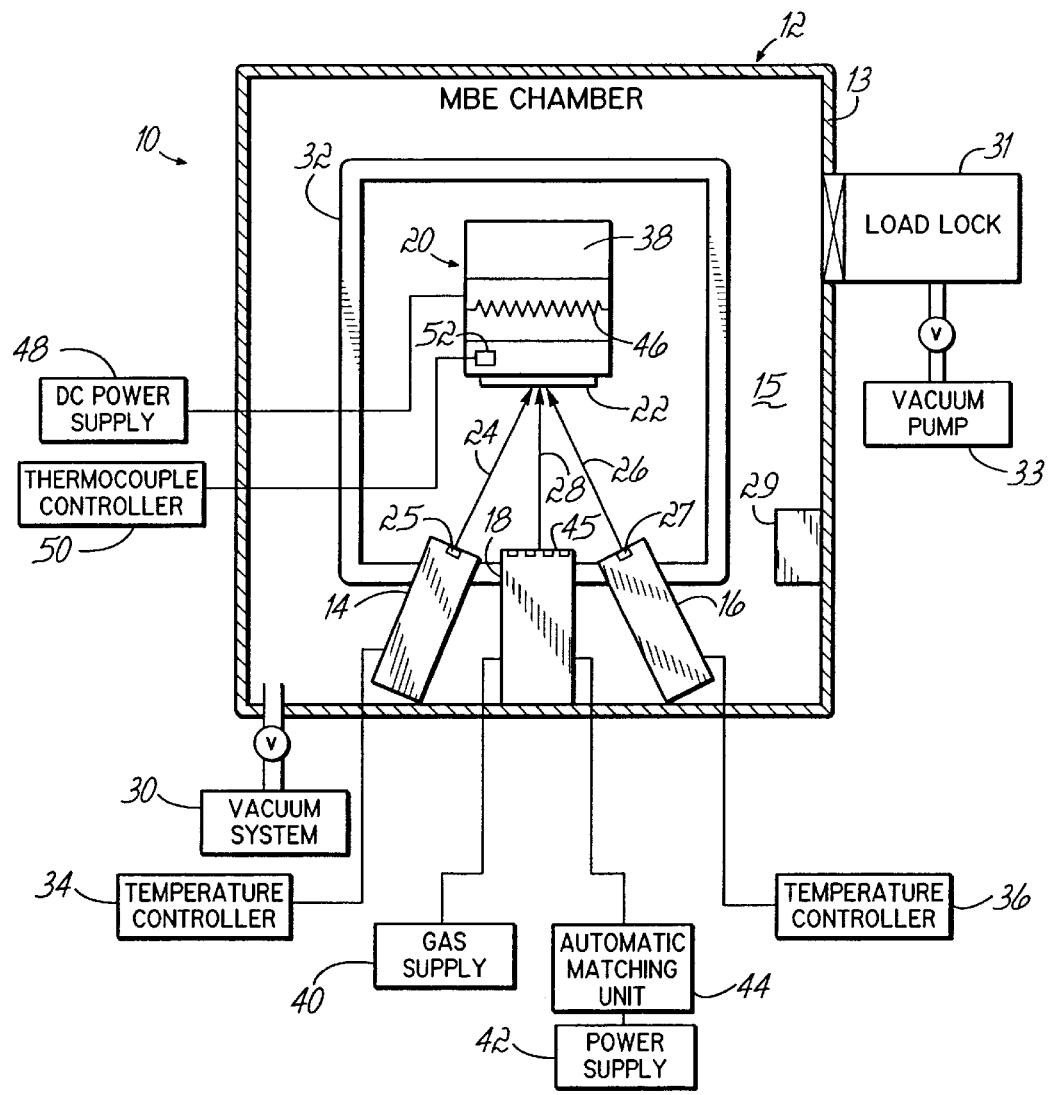
FIG. 1 is a schematic view of a molecular beam epitaxy system for depositing thin films of the present invention.

With reference to FIG. 1, a molecular-beam-epitaxy (MBE) system suitable for depositing epitaxial layers, including thin films and thick films, of zinc oxide (ZnO) on a single crystal ZnO substrate according to the present invention is indicated generally by reference numeral 10. The MBE system 10 includes a vacuum chamber 12 having a chamber wall 13 that surrounds a vacuum processing space 15. Positioned within the vacuum processing space 15 are a plurality of, for example, two Knudsen-type or effusion cells 14, 16, a radio frequency (RF) plasma source 18, and a substrate holder 20 adapted to support a substrate 22. The substrate holder 20 orients an exposed surface of the substrate 22 in a confronting, line-of-sight relationship with molecular beams 24, 26 of source material output from the effusion cells 14, 16, respectively, and an active flux 28 of reactive atomic species, including neutrals, radicals, ions and molecules, originating from RF plasma source 18. The molecular beams 24, 26 and active flux 28 are upwardly directed toward the substrate 22 and converge at the exposed surface of substrate 22 with a substantially overlapping relationship. It is appreciated that the MBE system 10 may include additional effusion cells oriented relative to substrate 22 and each providing a molecular beam derived from a specific elemental or compound source material for sequential depositions or co-deposition on the confronting surface of substrate 22 with one or more of molecular beams 24, 26 and active flux 28.

When depositing an epitaxial layer on substrate 22, vacuum processing space 15 generally must be placed under a vacuum and, typically, under an ultra-high vacuum in order to limit the incorporation of extraneous species from the residual partial pressures of gas atoms in vacuum processing space 15. To provide a Suitable vacuum environment, the vacuum chamber 12 is coupled in fluid communication with an appropriate vacuum system 30, including suitable conventional vacuum pumps and valves, for providing the desired vacuum pressure within vacuum processing space 15. The chamber wall 13 is appropriately configured with the necessary ports for introducing a vacuum into vacuum processing space 15, as is known in the art. A typical base vacuum for the vacuum processing space 15 is about $1 \times 10^{-9}$ Torr to about $9 \times 10^{-9}$ Torr. The pressure in the vacuum chamber 12 is monitored using a pressure measurement device 29, such as a nude Bayard-Alpert ionization gauge, suitable to accurately measure pressures in the operating vacuum range of the MBE system 10.

With continued reference to FIG. 1, a load lock chamber 31 is coupled in selective fluid communication with vacuum chamber 12 and is operative for introducing substrate 22 into the vacuum chamber 12. To that end, the load lock chamber 31 includes a vacuum pump 33 operative for evacuating the chamber 31 from atmospheric pressure, after substrate 22 is introduced therein through a loading port (not shown) from the surrounding ambient environment, to a significantly reduced pressure in preparation for transferring substrate 22 into the vacuum environment of vacuum processing space 15. A conventional substrate manipulator (not shown) is provided for accomplishing the transfer of substrate 22 from the load lock chamber 31 to the sample holder 20 inside the vacuum chamber 12.

The substrate holder 20, the effusion cells 14, 16, and the RF plasma source 18 are substantially surrounded by a cryopanel or cryogenic shroud 32. A cryogenic fluid or coolant, such as liquid nitrogen, is provided in a conventional manner through the shroud 32, which is thermally isolated from the vacuum chamber 12. The cryogenic fluid operates by thermal conduction to lower the temperature of the exterior surfaces of the shroud 32 to a temperature comparable to the temperature of the cryogenic fluid, which is about 77K for liquid nitrogen. Residual gases and elements not otherwise evacuated from the vacuum processing space 15 by the vacuum system 30 are captured or pumped by the cold exterior surfaces of shroud 32.

Each of the effusion cells 14, 16 includes an orifice or aperture 25, 27, respectively, that provides an effusion port which effects the controlled, collimated emission of the respective molecular beams 24, 26 formed from evaporated, vaporized or sublimed source material. Each of the molecular beams 24, 26 has a well-defined angular distribution as understood by those of ordinary skill in the art. Each of the effusion cells 14, 16 is spaced from the substrate 22 by a substrate-to-source distance appropriate to provide an effective and relatively uniform beam flux at the position of substrate 22.

With continued reference to FIG. 1, each of the effusion cells 14, 16 is electrically heated to cause the emission of molecular beams 24, 26 from the apertures 25, 27, respectively, by one of evaporation, vaporization or sublimation. To that end, each of the effusion cells 14, 16 includes a resistance heater (not shown) electrically coupled in a known manner with one of a pair of temperature controllers 34, 36. The temperature controllers 34, 36 are each adapted to regulate the temperature of the appropriate effusion cells 14, 16 and, hence, to regulate the flux magnitudes of the molecular beams 24, 26 emitted from cells 14, 16. A signal or information representative of one of the molecular beams 24, 26 may be detected by a suitable beam flux monitor 38, such as a nude Bayard-Alpert ionization gauge, movable into the beam path near the position of the substrate 22 so as to provide a beam equivalent pressure. To that end, the substrate holder 20 is rotatable with substrate 22 supported on one side, and an opposite side supporting the beam flux monitor 38 so that either monitor 38 or the substrate 22 is exposed to the upwardly-directed molecular beams 24, 26. The substrate holder 20 is rotated to alternatively expose the beam flux monitor 38 to the molecular beams 24, 26 in order to measure the beam flux and the substrate 22 is rotated with its exposed surface oriented toward the beams 24, 26 to deposit or form an epitaxial layer.

Each of the effusion cells 14, 16 has an individual mechanical shutter (not shown) controllably movable into and out of the respective beam path for selectively initiating and terminating the exposure of the substrate 22 to the molecular beams 24, 26 selectively. A primary mechanical shutter (not shown) provided proximate the substrate 22 is selectively positionable for isolating substrate 22 by blocking molecular beams 24, 26. The configuration of the substrate holder 20 and the mechanical shutters accurately control the duration of the exposure of substrate 22 or beam flux monitor 38 to either of the beams 24, 26 and, thus, contribute to close control of the formation of the epitaxial layer on substrate 22.

The signal representative of, for example, molecular beam 24 is delivered from the beam flux monitor 38 to temperature controller 34 for controlling the effusion cell 14 so as to establish beam 24 at a desired beam flux or to maintain beam 24 at a stable and constant beam flux. To that end, temperature controller 34 directly controls the respective electric current or power applied to the resistance heater of effusion cell 14. Alternatively, a signal from beam flux monitor 38 indicative of molecular beam 26 can be provided to temperature controller 36 for controlling the temperature of effusion cell 16. Typically, the applied power output by each temperature controller 34, 36 ranges from about 50 watts to about 600 watts. An exemplary temperature controller is the Model 818P temperature controller commercially available from Eurotherm Controls Inc. (Leesburg, Va.).

A chamber axis extending between the surface normal of the substrate 22 and the normal to the apparatus 25, 27 of each of the effusion cells 14, 16 is inclined at an oblique angle of about 30° (i.e., perpendicular to the plane of FIG. 1) from a horizontal plane generally coplanar with the surface of the substrate 22. By effecting such an angular relationship, material deposited from molecular beams 24, 26 on various exterior surfaces of the sample holder 20 and/or substrate 22 cannot flake and delaminate as small particulates capable of falling under the influence of gravity to contaminate the effusion cells 14, 16.

Each of the effusion cells 14, 16 is lined with a crucible (not shown) that receives the source material. Each crucible is formed of a material that has a significant thermal conductivity and a high melting point, and which is non-reactive with the source material in at least its molten state. The crucibles may be formed of one of various materials, including pyrolytic boron nitride (PBN), PBN coated with aluminum nitride, quartz, semi-metals such as graphite, or refractory metals such as tantalum or molybdenum.

The source material is typically added to the crucibles of the effusion cells 14, 16 in a solid form. The solid source material is melted, vaporized and emitted through the effusion port of effusion cells 14, 16 to provide molecular beams 24, 26, respectively. To provide a molecular beam 24 comprising zinc (Zn), one of the effusion cells, for example effusion cell 14, may be charged with a quantity of high purity (typically 6N+) solid zinc source material. Similarly, effusion cell 16 may be charged with a quantity of high purity solid magnesium (Mg) or cadmium (Cd) source material. Alternatively, certain solid source materials may be directly sublimed from effusion cell 16. For example, effusion cell 16 may be charged with a quantity of a lithium-bearing compound, such as lithium hydroxide, for providing a molecular beam 26 containing lithium (Li). An effusion cell particularly suitable for use as effusion cells 14, 16 for the deposition of Zn in MBE system 10 is a dual-zone effusion cell available commercially from Effusion Sciences (Hudson, Wis.) A pyrolytic boron nitride crucible suitable for use with such dual-zone effusion cells is commercially available, for example, from Advanced Ceramics Corporation (Cleveland, Ohio).

With continued reference to FIG. 1, the RF plasma source 18 is coupled in fluid communication with a gas supply 40 configured to supply a process gas suitable for forming a plasma. Typically, the process gas has a high, research-grade purity and is supplied at a flow rate ranging from about 1 standard cubic centimeters per minute (SCCM) to about 5 SCCM. Gas supply 40 may include a manifold (not shown) for providing multiple process gases individually or in mixtures to RF plasma source 18 and may also include one or more leak valves, mass flow controllers or the like (not shown) for regulating the flow of each process gas. Exemplary process gases include oxygen, nitrogen, nitrogen/argon mixtures, and the like, as appreciated by persons of ordinary skill in the art. Gas supply 40 may also supply other process gases, such as hydrogen, necessary for processing.

The RF plasma source 18 is operative for generating a plasma from the process gas. To that end, an RF power supply 42 is electrically interconnected in a known manner with the RF plasma source 18 using an automatic tuning circuit 44. The RF power supply 42 is operative to provide an operating power for coupling electrical energy into the confines of the source 18 to generate a plasma. The RF plasma source 18 is operated at gas pressures within the vacuum processing space 15 ranging from about $1 \times 10^{-6}$ Torr to about $1 \times 10^{-3}$ Torr and an operating power of less than about 600 watts. An exemplary RF power supply suitable for use in the present invention is the Model RFX600 RF power supply commercially available from Advanced Energy Inc. (Fort Collins, Colo.). An exemplary automatic tuning circuit is the Model ATM600 automatic tuning unit commercially available from Oxford Applied Research (Oxfordshire, United Kingdom).

The RF plasma source 18 is appropriately configured, as is known in the art, for extracting various atomic species of low kinetic energy from the plasma through a perforated aperture plate 45 to generate the active flux 28. The active flux 28 of atomic species, including radicals, ions, neutrals and molecules, formed by the plasma emission is directed toward the exposed surface of the substrate 22 when performing a deposition. It is understood that the active flux 28 may be utilized for cleaning the exposed surface of substrate 22 prior to performing a deposition. An exemplary RF plasma source 18 for generating the active flux 28 is commercially available as model number MPD21 from Oxford Applied Research (Oxfordshire, United Kingdom).

With continued reference to FIG. 1, the substrate holder 20 incorporates a resistive heater element 46 that is electrically coupled with a DC power supply 48. The DC power supply 48 is operative to provide electrical energy at a power level adequate to heat the substrate 22 to a deposition temperature ranging from about 350° C. to about 625° C. An exemplary DC power supply is the Sorenson Model DCS 60-18 commercially available from Elgar Electronics (San Diego, Calif.). The temperature of the substrate holder 20, which approximates the temperature of substrate 22, is measured using a thermocouple controller 50 electrically coupled in a known manner with a thermocouple 52. The thermocouple 52 is embedded in substrate holder 20 proximate to the backside of the substrate 22.

In use and with continued reference to FIG. 1, effusion cell 14 is charged with a quantity of high purity (typically 6N+) solid Zn source material. If an additional element, such as Mg or Cd, is to be co-deposited with Zn to form a ternary layer, or an additional element such as lithium is to be added as a dopant, effusion cell 16 is charged with a quantity of an appropriate high purity solid source material, such as Mg metal, Cd metal, or a lithium-bearing compound including lithium hydroxide (LiOH). Substrate 22 is loaded from the ambient environment surrounding the vacuum chamber 12 into the chamber load lock 31 of the MBE system 10. While maintaining the vacuum chamber 12 in isolation and continuously pumping with vacuum system 30, the chamber load lock 31 is evacuated using vacuum pump 33 from atmospheric pressure to a vacuum level suitable for establishing fluid communication with the vacuum processing space 15. When such a suitable vacuum level is established in load lock chamber 31, the substrate 22 is transferred from the load lock chamber 31 into the vacuum chamber 12 and positioned on the substrate holder 20 so that an exposed surface thereof confronts the effusion cells 14, 16 and the RF plasma source 18.

Before depositing the ZnO layer, the exposed surface of substrate 22 may be prepared with an in situ cleaning process. A typical in situ cleaning process involves heating the substrate 22 to a temperature in the range of about 500° C. to 850° C., perhaps with a ramped temperature profile or schedule, and contemporaneously exposing the surface to an active flux 28 of atomic species, such as a mixture of radicals, neutrals, ions, and molecules of hydrogen and oxygen, generated from a mixture of hydrogen and oxygen process gases by RF plasma source 18. The cleaning process promotes adhesion of the deposited layer to substrate 22, promotes crystalline alignment of the lattice structure of the layer with the substrate 22, and improves the crystalline quality of the lattice structure of the deposited ZnO layer by etching a thin surface layer for reducing potential defect centers.

After cleaning, the temperature of substrate 22 is monitored with thermocouple 50 and thermocouple controller 52 to establish the desired deposition temperature, typically between about 350° C. and about 625° C. A ZnO layer is then deposited on the exposed surface of substrate 22 using molecular beam 24 comprising Zn from effusion cell 14 and active flux 28 having oxygen-containing atomic species generated by the plasma in RF plasma source 18. To that end, effusion cell 14 is heated using temperature controller 34 to provide molecular beam 24 comprising Zn. The magnitude of the flux constituting molecular beam 24 is measured by rotating the beam flux monitor 38 into the path of beam 24 and opening the associated mechanical shutter briefly to expose the beam flux monitor 38 to beam 24 so as to provide a beam equivalent pressure. The temperature of effusion cell 14 is adjusted by varying the output power from temperature controller 34 to provide a desired flux magnitude for molecular beam 24 at the position of the exposed surface of substrate 22.

If additional effusion cells are utilized in MBE system 10 to deposit a ZnO-based layer or a doped ZnO layer, as may be the case, a similar real-time flux measurement and operating temperature adjustment is performed for each cell to establish a desired flux magnitude. For example, effusion cell 16, having been charged with a solid source material, may be heated using temperature controller 36 to provide molecular beam 26. Before initiating the deposition of the ZnO-based layer, the beam flux monitor 38 is rotated into the path of beam 26 and the associated mechanical shutter is opened briefly so as to provide a beam equivalent pressure indicative of the flux of beam 26. The temperature of effusion cell 16 is adjusted by varying the output power from temperature controller 36 to provide a desired flux at the position of the exposed surface of substrate 22.

To provide active flux 28, a flow of one or more process gases is provided to the RF plasma source 18 from the gas source 40. A portion of the process gas flows through the RF plasma source 18 without plasma activation into the vacuum chamber 12 and elevates the pressure therein. Power supply 42 is used to energize RF plasma source 18 to provide active flux 28 of atomic species that supply a dopant or optionally an additional element to the ZnO layer being deposited. The active flux 28 may be quantified with either beam flux monitor 38 that indicates a beam equivalent pressure or pressure measurement device 29 that indicates an incremental partial pressure contributing to the total pressure within vacuum processing space 15. In particular, a flow of an oxygen-containing process gas, such as molecular oxygen ($O_2$), to the RF plasma source 18 contributes various oxygen-containing atomic species to plasma emission forming the active flux 28, which combines with the Zn-containing atomic species in molecular beam 24 at the exposed surface of substrate 22 to deposit as the ZnO layer.

If the deposited epitaxial ZnO layer is undoped, the layer will exhibit intrinsic n-type conduction due to the presence of excess donors. However, the electrical properties of the epitaxial ZnO layer may be modified during deposition by incorporating either a p-type dopant or an n-type dopant in an amount sufficient to achieve a desired atomic concentration or doping level of the layer so as to achieve either n-type or p-type conduction, respectively. Suitable p-type dopants for providing p-type conduction include, but are not limited to, nitrogen, phosphorus, arsenic, antimony and bismuth from Group VA of the Periodic Table. Suitable n-type dopants for providing n-type conduction include, but are not limited to, boron, aluminum, gallium, indium and thallium from Group IIIA of the Periodic Table and fluorine, chlorine, bromine and iodine from Group VIIA of the Periodic Table. Chlorine and aluminum are particularly suitable n-type dopants. These n-type or p-type dopants may be provided, as appropriate, by either charging effusion cell 16 with a quantity of an appropriate solid source material to provide dopant species in the molecular beam 26 or by supplying a process gas containing the dopant species to the RF plasma source 18 for providing an active flux 28 containing atomic species of the dopant. The dopant in either molecular beam 26 or active flux 28, as may be the case, is established at a level effective to introduce a suitable atomic concentration of dopant, which chemically combines at the exposed surface of the substrate 22 along with zinc in molecular beam 24 emitted from effusion cell 14 and oxygen in active flux 28 from RF plasma source 18.

As a specific example, nitrogen operates as a p-type dopant in ZnO and may be provided in active flux 28 by providing a flow of a nitrogen-containing gas, such a mixture of 10% by volume nitrogen/90% by volume argon, to the RF plasma source 18 for introducing a supply of N-containing atomic species into the active flux 28, which are incorporated into the deposited ZnO epitaxial layer to provide p-type conduction. A bilayer structure may be fabricated on substrate 22 by depositing a second epitaxial ZnO layer on the p-type ZnO layer that incorporates an n-type dopant conveyed in either active flux 28 or molecular beam 26 or that lacks a dopant so as to exhibit intrinsical n-type conduction. It is appreciated that additional effusion cells may be added to the MBE system 10 for providing additional molecular beams containing, for example, Mg or Cd for co-deposition with the molecular beams 24, 26 provided from one or both of effusion cells 14, 16 and/or the active flux 28 provided from RF plasma source 18. Alloying with Mg or Cd is known to vary the energy of the band gap of ZnO for purposes of band gap engineering.

Deposition proceeds when the active flux 28 from RF plasma source 18, the flux of molecular beam 24 from effusion cell 14 and, if provided, the flux of molecular beam 26 from effusion cell 16 are stable. The magnitude and constituent species of active flux 28 are controlled with gas supply 40 and RF power supply 42. The fluxes of molecular beams 24, 26 are modulated and controlled by adjusting the associated shutters and by varying the temperatures of the effusion cells 14, 16. The molecular beams 24, 26 and active flux 28 are applied to the exposed surface of the substrate 22 for a duration sufficient to epitaxially deposit an epitaxial zinc oxide-based layer of a given thickness on the exposed surface. Generally, MBE system 10 is operable for depositing single epitaxial layers of zinc oxide-based material, such as high quality epilayers, and multilayer structures of differing zinc oxide-based materials, including heterojunctions, superlattices and multiple quantum wells, on substrate 22. Each deposited epitaxial layer may consist of a binary ZnO, a ternary ZnO-based compound, or a quaternary ZnO-based compound and may incorporate either an n-type or p-type dopant present in an atomic concentration sufficient to provide either n-type or p-type conduction, respectively.

Figure 2:
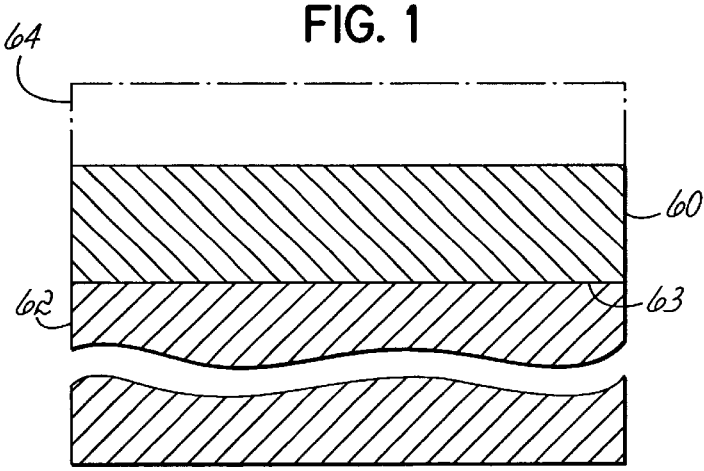
FIG. 2 is a schematic cross-sectional view of an embodiment of a semiconductor structure constructed in accordance with principles of the present invention.

With reference to FIG. 2, a semiconductor structure comprising a layer 60 of p-doped zinc oxide (ZnO) deposited epitaxially on a single crystal ZnO substrate 62 using MBE system 10 (FIG. 1) is shown. It is understood that the p-type ZnO layer 60 may comprise either a thin film or a thick film, as those terms are understood by persons of ordinary skill in the art, depending upon the thickness of layer 60. Although the ZnO substrate 62 is illustrated as a wafer of a given thickness, the present invention is not so limited. Specifically, the ZnO substrate 62 need only comprise a single crystal substrate of a given thickness and may be supported by an underlying support structure. It is also appreciated that the p-type ZnO layer 60 may be deposited, without limitation, on either the Zn-terminated face or the O-terminated face of ZnO substrate 62.

The p-type ZnO layer 60 is deposited homoepitaxially on the ZnO substrate 62 using the MBE system 10 (FIG. 1) with a thickness ranging typically between about 25 nm and about 2 μm for epilayers and heterojunctions and thinner layers if cooperating in a superlattice or multiple quantum well structure. Oxygen-containing species in active flux 28 combine with Zn in molecular beam 24 to form a continuously-thickening ZnO layer 60. The ZnO layer 60 deposits epitaxially on the ZnO substrate 62 with a crystalline orientation, lattice parameters substantially identical to those of the substrate 62. Any variations in lattice parameter of the homoepitaxial ZnO layer 60 relative to the ZnO substrate 62 results from the presence of the small atomic concentration of dopant species in layer 60 and represents a small effect. A typical deposition rate for the ZnO layer 60 on ZnO substrate 62 ranges from about 0.5 nm/min to about 5 nm/min.

Nitrogen is introduced into p-type ZnO layer 60 by applying a N-containing atomic species in active flux 28 that operates to alter the electrical properties of layer 60 and, more specifically, that serves as a p-type dopant for the purpose of establishing p-type conduction in the ZnO layer 60. The p-type dopant is present in an amount sufficient to achieve a desired atomic concentration or doping level of ZnO layer 60 so as to provide a desired p-type conduction. During the deposition of the ZnO layer 60, nitrogen is incorporated into layer 60 as a p-type dopant with an approximately uniform atomic concentration and operates, when activated, to establish p-type conduction. The resultant ZnO layer 60 comprises a nitrogen-doped layer of zinc oxide (ZnO:N) and exhibits p-type conduction. It is appreciated that, in addition to nitrogen, other p-type dopants, such as phosphorus, arsenic, antimony, and bismuth, may be employed to provide the ZnO layer 60 with p-type conductivity without departing from the spirit and scope of the present invention.

The ZnO layer 60 is expected to have a Hall mobility of less than about 10 cm$^2$/(V·sec) and a carrier concentration of less than about $1 \times 10^{18}$ acceptors/cm$^3$. For nitrogen, it is believed that the efficiency in the ZnO layer 60 for creating electrically active nitrogen is on the order of 1 percent to 10 percent so that, for example, a carrier concentration of $1 \times 10^{18}$ acceptors/cm$^3$ will require that the atomic nitrogen atomic concentration be approximately one to two orders of magnitude larger or about $1 \times 10^{19}$ cm$^{-3}$ to about $1 \times 10^{20}$ cm$^{-3}$.

In certain embodiments of the present invention, an atomic concentration of a compensating dopant or atomic species is incorporated into the p-type ZnO layer 60. According to principles of the present invention, the compensating dopant in the ZnO layer 60 cooperates with the p-type dopant in providing a suitable p-type doping technique for depositing p-type ZnO layer 60 with molecular beam epitaxy. It is understood that an atomic concentration of any suitable element, including but not limited to the elements found in Group I of the Periodic Table such as lithium (Li), sodium (Na), potassium (K) or rubidium (Rb), may be utilized as a compensating dopant in the ZnO layer 60. The compensating dopant may be introduced into ZnO layer 60 either by diffusion from the ZnO substrate 62 or by co-deposition in the MBE system 10 (FIG. 1) as an atomic species in either molecular beam 26 originating from effusion cell 16 or active flux 28 originating from the RF plasma source 18.

As is generally accepted, zinc oxide incorporates a significant excess concentration of uncompensated carriers (donors), which significantly lowers the resistivity of the material and results in n-type conduction. According to the principles of the present invention, the atomic concentration of the compensating dopant creates deep-level traps in the p-type ZnO layer 60, which promote recombination of the excess donors to effectively compensate for the excess donor concentration. The p-type dopant independently provides the acceptors that create p-type conduction in the ZnO layer 60. In one aspect of the invention, the incorporation of the compensating dopant into the crystalline structure of the ZnO layer 60 reduces the atomic concentration of p-type dopant required to provide the desired carrier concentration.

Due to its relatively fast diffusion rate in ZnO, Li is a particularly useful compensating dopant and the present invention will be described below with specific reference to the incorporation of Li into p-type ZnO layer 60. However, it is understood that the use of an alternative compensating dopant species, such as Na, K or Rb, is contemplated by the principles of the present invention. To provide full compensation of the excess donor concentration, the atomic concentration of Li present in the ZnO layer 60 is believed to be on the order of $1 \times 10^{19} cm^{-3}$ to $1 \times 10^{20} cm^{-3}$.

In certain embodiments of the present invention, the compensating dopant is diffused into the ZnO substrate 62 before the p-type ZnO layer 60 is deposited. As a specific example, an atomic concentration of Li is drifted or diffused at an elevated temperature into the ZnO substrate 62. The Li atoms compensate for the carrier imbalance in the ZnO substrate 62 so that, following the Li-drifting procedure, the ZnO substrate 62 has a low net concentration of uncompensated carriers and an enhanced resistivity. During deposition, ZnO substrate 62 is heated to the desired deposition temperature and Li atoms are transported by diffusion from the ZnO substrate 62 into the ZnO layer 60. It is appreciated that the diffusion of Li from the ZnO substrate 62 into the ZnO layer 60 may be induced by a post-deposition thermal anneal in a vacuum furnace at a given diffusion temperature, for example, in the range of about 525° C. to about 800° C., for which any p-type dopant in the ZnO layer 60 is not adversely affected.

In an alternative embodiment of the present invention, effusion cell 16 in the MBE system 10 (FIG. 1) may be charged with a Li-bearing source material, such as LiOH, for generating Li atomic species in molecular beam 26. Molecular beam 26 provides a separate and independent flux comprising Li atomic species, which is co-deposited on the ZnO substrate 62 along with the molecular beam 24 containing Zn and the active flux 28 of N-containing and/or O-containing atomic species. According to this specific embodiment, the ZnO substrate 62 is not doped with a compensating dopant and, therefore, remains undoped for those device applications in which n-type conduction is desired for substrate 62.

It is appreciated that a compensating dopant, such as Li, is not required in the ZnO layer 60 in order to provide p-type conductivity. To that end, the stoichiometry of the ZnO layer 60 may be varied to provide a Zn-rich or an O-rich material that lacks a significant concentration of uncompensated donors, which obviates the need for an atomic concentration of a compensating dopant.

Homoepitaxial deposition of the p-type ZnO layer 60 on ZnO substrate 62 provides ZnO layer 60 with excellent bulk and surface microstructures, uniform and optimized doping, and optical and electrical properties that are reproducible in successively deposited layers and enhances the properties of devices made on and/or in layer 60. The morphology of the microstructure of the ZnO layer 60 is enhanced because layer 60 is substantially lattice matched to the ZnO substrate 62 and because layer 60 and substrate 62 have substantially identical coefficients of thermal expansion. As a result, homoepitaxy on single crystal ZnO substrate 62 significantly reduces the number of defects, such as misfit dislocations and threading dislocations, in the ZnO layer 60. It is known that ZnO layers deposited heteroepitaxially on diverse substrates, such as gallium arsenide, silicon or sapphire, have large mismatches in lattice parameters with the substrate and differing coefficients of thermal expansion that contribute to the introduction of significant numbers of misfit and threading dislocations into the deposited ZnO layers. In addition, the improvement in the crystalline quality manifested by the reduction in defect density resulting from the homoepitaxial deposition of ZnO layer 60 on ZnO substrate 62 allows the introduction of a higher concentration of uncompensated donors and an enhanced probability of obtaining uncompensated acceptors and p-type conductivity. The ZnO layer 60 is substantially free of surface imperfections that can cause device failure and provides for increased reliability of the finished semiconductor device and greater efficiencies during the semiconductor manufacturing process.

Moreover, the homoepitaxial deposition obviates the need for an intermediate layer of a different compound typically required for lattice matching a deposited layer of ZnO with a substrate such as gallium arsenide or sapphire. In that regard, the crystalline structure of the p-type ZnO layer 60 is substantially identical to the crystalline structure of the ZnO substrate 62. Specifically, the ZnO layer 60 and the ZnO substrate 62 both have a wurtzite crystal structure characterized by substantially identical lattice parameters and crystalline orientation, and based on a hexagonal close-packed (hcp) lattice structure in which the Zn atoms are located on one hcp sublattice and the O atoms are located on a second interpenetrating hcp sublattice. The homoepitaxial deposition of ZnO layer 60 on ZnO substrate 62 also provides a chemical match. This aspect is important because it is known that heteroepitaxy of ZnO on a dissimilar substrate can result in a chemical interaction between the substrate and the species operating to deposit the ZnO layer. Therefore, an intermediate layer of a different compound can be created at the interface between the substrate and the heteroepitaxially-deposited ZnO layer. An intermediate layer is not required or otherwise unintentionally created between ZnO layer 60 and ZnO substrate 62.

With continued reference to FIG. 2, a ZnO layer 64, shown in dashed lines in FIG. 2, may be deposited homoepitaxially using the MBE system 10 (FIG. 1) on the p-type ZnO layer 60 covering ZnO substrate 62. ZnO layer 64 is generally coextensive with the ZnO layer 60 at an interface 63. Similar to the deposition of ZnO layer 60 in MBE system 10 (FIG. 1), oxygen-containing atomic species in flux 28 combine with Zn in molecular beam 24 to form a continuously-thickening ZnO layer 64, which deposits epitaxially on the p-type ZnO layer 60 with crystalline orientation, lattice parameters and thermal expansion coefficient substantially identical to that of layer 60. Specifically, the lattice parameters and thermal expansion coefficients of ZnO layers 60, 64 are substantially identical with the only variations arising from differing dopant atomic concentrations.

The electrical properties of ZnO layer 64 differ from the electrical properties of ZnO layer 60. To that end, ZnO layer 64 either is undoped, incorporates a different atomic concentration of p-type dopant than present in ZnO layer 60, or incorporates an atomic concentration of an n-type dopant. In addition, an atomic concentration of a compensating dopant may be provided in ZnO layer 64 for compensating the excess donors. The dopant or dopants are present in ZnO layer 64 in an atomic concentration sufficient to achieve a desired level of n-type or p-type conduction, or to provide intrinsic ZnO material. The dopants may be provided in one of molecular beam 26 and active flux 28, as may be the case and as described above with regard to ZnO layer 60. In certain embodiments, the ZnO layer 64 may operate as an active layer in a semiconductor structure formed on ZnO substrate 62.

Figure 3:
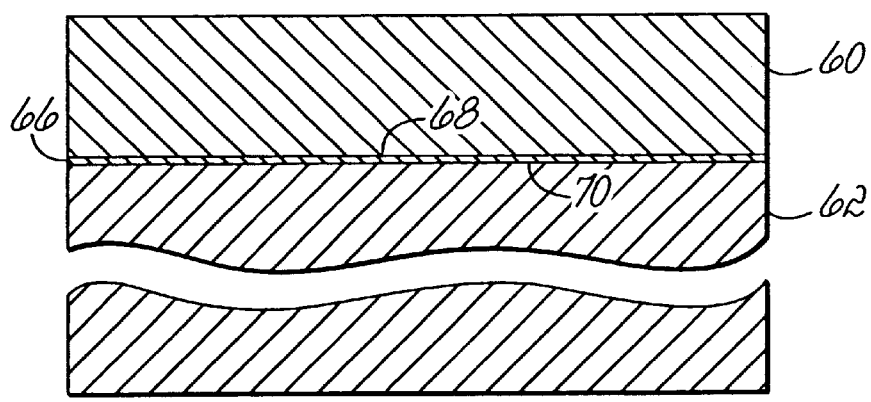
FIG. 3 is a schematic cross-sectional view of an alternative embodiment of a semiconductor structure constructed in accordance with principles of the present invention.

With reference to FIG. 3 in which like reference numerals refer to like features in FIG. 2, an alternative embodiment of a semiconductor structure of the present invention is illustrated in which an epitaxial buffer layer 66 is provided between the p-type ZnO layer 60 and the ZnO substrate 62. Buffer layer 66 is generally coextensive with the ZnO layer 60 at one interface 68 and is generally coextensive with the ZnO substrate 62 at a second interface 70. Similar to the deposition of ZnO layer 60 in MBE system 10 (FIG. 1), oxygen-containing atomic species in flux 28 combine with Zn in molecular beam 24 to form a continuously-thickening buffer layer 66, which deposits epitaxially on the p-type ZnO layer 60 with a crystalline orientation, lattice parameters and thermal expansion coefficient substantially identical to those of layer 60. Specifically, the lattice parameters and thermal expansion coefficients of ZnO layer 60 and buffer layer 66 are substantially identical with the only variations arising from differing dopant atomic concentrations. Similarly, the lattice parameters and thermal expansion coefficients of ZnO substrate 62 and buffer layer 66 are substantially identical with the only variations arising from differing dopant atomic concentrations.

The epitaxial buffer layer 66 has electrical properties that differ from the electrical properties of ZnO layer 60 and that may differ from the electrical properties of ZnO substrate 62. To that end, buffer layer 66 either is undoped, incorporates a different atomic concentration of p-type dopant than present in ZnO layer 60, or incorporates an atomic concentration of an n-type dopant. In addition, an atomic concentration of a compensating dopant may be provided in buffer layer 66 to compensate the excess donors. The dopant or dopants are present in buffer layer 66 in an atomic concentration sufficient to achieve a desired level of n-type or p-type conduction, or to provide intrinsic ZnO material. The dopants may be provided in one of molecular beam 26 and active flux 28, as may be the case and as described above with regard to ZnO layer 60. Although buffer layer 66 is illustrated in FIG. 3 as being thinner than ZnO layer 60, it is contemplated by the present invention that buffer layer 66 may have a thickness equal to or greater than the thickness of ZnO layer 60. Generally, the buffer layer 66 may have a thickness ranging from one monolayer (about 2 nm) to about 2 μnm.

In certain embodiments, the buffer layer 66 may operate as a diffusion barrier that reduces or limits the diffusion of the compensating dopant from the ZnO substrate 62 into the ZnO layer 60. In other embodiments, the buffer layer 66 may operate as an active layer in a semiconductor structure formed on ZnO substrate 62. In still other embodiments, the buffer layer 66 may be provided as an intermediate layer that effectively improves the crystalline quality of ZnO substrate 62 before depositing ZnO layer 60.

Further details and an embodiment of the invention will be described in the following examples.

EXAMPLE 1

A single crystal ZnO substrate was prepared from a boule or ingot of single crystal ZnO. The surface normal of the ZnO ingot was oriented relative to the (0001) crystal direction, as verified with x-ray Laue measurements, within ±0.5° and the ZnO ingot was sliced with a conventional sawing process to produce a ZnO substrate having a thickness of about 0.75 mm. The ZnO substrate was wet etched by immersion for 5 minutes in an etchant solution consisting of approximately 5% by volume trifluroacetic acid in deionized water, in which the etchant solution was heated to a temperature of about 90° C. and slightly agitated. The wet etch process removed a work-damaged thickness of material from each face of the ZnO substrate. Both faces of the etched ZnO substrate were then mechanically lapped with 9 micron aluminum oxide suspended in a carrier liquid so as to increase the flatness. Next, the Zn-terminated and O-terminated faces of the etched and lapped ZnO substrate were each polished with a chemo-mechanical process to remove material damaged by the mechanical lapping process, cleaned with a wet cleaning process and/or rinse, and dried using a spin dryer. After this final processing step, the ZnO substrate had a thickness of about 0.62 mm. An atomic concentration of lithium was then diffused into the ZnO substrate to enhance the resistivity. Thereafter, the Zn-terminated face of the lithium-drifted ZnO (ZnO:Li) substrate was chemo-mechanically polished for 5 minutes to remove surface contamination from the Li-diffusion process and near-surface defects.

The ZnO:Li substrate was loaded into the MBE system through the chamber load lock. The ZnO:Li substrate was positioned on the substrate holder with the Zn-terminated face exposed in a confronting relationship with the effusion cells and the RF plasma source. Before performing a deposition, the ZnO:Li substrate was pretreated thermally using a stepped temperature profile that ramped the substrate temperature from about 650° C. to about 825° C. over a 25 minute period. The substrate temperature was monitored by the thermocouple provided in the substrate holder proximate to the backside of the substrate. For the final 20 minutes of the thermal pretreatment, the Zn-terminated face of the ZnO:Li substrate was exposed to an active flux comprising hydrogen and oxygen atomic species from the RF plasma source. To that end, the RF plasma source was supplied with a process gas mixture of hydrogen at a partial pressure of about $6 \times 10^{-5}$ Torr and oxygen at a partial pressure of about $5 \times 10^{-6}$ Torr and was energized with an operating power of about 250 watts. Exposure of the ZnO:Li substrate with the active flux containing hydrogen and oxygen was continued for about 3 minutes after the conclusion of the thermal pretreatment as the temperature of the ZnO:Li substrate cooled from about 825° C. to about 525° C.

After stabilizing the temperature of the ZnO:Li substrate at about 525° C., the residual atmosphere containing hydrogen, oxygen and volatile substances removed from the ZnO:Li substrate was evacuated from the vacuum chamber. While the ZnO:Li substrate was held at about 525° C., a thin film of p-doped ZnO was deposited on the Zn-terminated face of the ZnO:Li substrate. To that end, one effusion cell charged with a quantity of high purity (6N+) solid zinc source material was heated to provide a zinc molecular beam, measured with the beam flux monitor, having a beam equivalent pressure of about $1.1 \times 10^{-7}$ Torr. Contemporaneously, the RF plasma source was supplied with a flow of a high purity process gas consisting of 10% by volume nitrogen/90% by volume argon mixture sufficient to increase the chamber pressure to about $5.5 \times 10^{-6}$ Torr and a flow of a high purity oxygen sufficient to further increase the chamber pressure to about $8 \times 10^{-5}$ Torr. The RF plasma source was energized with about 550 watts of power from the RF power supply so as to generate an active flux comprising various atomic species of oxygen and nitrogen. The reflected power was measured to be about 8 watts, which is indicative of efficient power coupling. As a result, the ZnO:Li substrate was exposed simultaneously to the Zn molecular beam and the active flux containing oxygen and nitrogen.

Oxygen atoms from the active flux combined with Zn to form a continuously-thickening layer of ZnO, which deposited epitaxially as a layer on the ZnO:Li substrate with a (0001) crystalline orientation identical to that of the substrate. During the deposition of the ZnO layer, nitrogen atoms from the active flux were incorporated into the layer as a p-type dopant. The p-type dopant was incorporated with an approximately uniform atomic concentration sufficient to establish p-type conductivity. The resultant layer was a nitrogen-doped layer of zinc oxide (ZnO:N). Lithium was believed to diffuse thermally from the ZnO:Li substrate into the depositing ZnO:N layer. The diffused Li atoms were incorporated into the crystal lattice of the ZnO:N layer to provide charge compensation for excess, uncompensated donors.

The aforementioned deposition conditions were maintained approximately constant over a 28 hour period. Following deposition, the substrate was cooled to room temperature and removed from the MBE system through the load lock. The resultant thickness of the epitaxial ZnO:N layer was measured to be approximately 1.9 $\mu$m, which represents a deposition rate of about 1.13 nm/min.

The electrical properties of the ZnO:N layer were characterized using a Hall effect measurement and a van der Pauw technique. The electrical property measurement confirmed that the epitaxial ZnO:N layer had p-type conduction and indicated a resistivity of about 35 ohm-cm, a Hall mobility of about 2 cm$^2$/(V·sec), and a carrier concentration of about $9 \times 10^{16}$ acceptors/cm$^3$.

EXAMPLE 2

A second single crystal ZnO:Li substrate was prepared as detailed above in Example 1. An epitaxial layer of ZnO:N was deposited homoepitaxially on the second single crystal substrate using identical deposition conditions to those used in Example 1, with one distinction with regard to chamber pressure during deposition. After setting the flows of process gases to the plasma source to provide a chamber pressure of about $8 \times 10^{-5}$ Torr, the vacuum pumping rate was increased to reduce the chamber pressure to about $4.9 \times 10^{-5}$ Torr.

Thereafter, the ZnO:Li substrate was exposed simultaneously to the Zn molecular beam and the active flux containing various atomic species of oxygen and nitrogen. Oxygen atoms from the oxygen-containing species combined with Zn to form a continuously-thickening layer of ZnO, which was deposited epitaxially as a layer on the ZnO:Li substrate with a (0001) crystalline orientation identical to that of the substrate. Nitrogen atoms from the nitrogen-containing species were incorporated into the layer of ZnO as a p-type dopant during deposition.

The aforementioned deposition conditions were maintained approximately constant over a 28 hour period. Following deposition, the substrate was cooled to room temperature and removed from the MBE system through the load lock. The resultant thickness of the epitaxial ZnO:N layer was measured to be approximately 1.35 $\mu$m, which represents a deposition rate of about 0.80 nm/min.

The electrical properties of the ZnO:N layer were characterized using a Hall effect measurement and a van der Pauw technique. The electrical property measurement confirmed that the epitaxial ZnO:N layer had p-type conduction and indicated a resistivity of about 3.1 ohm-cm, a Hall mobility of about 2 cm$^2$/(V·sec), and a carrier concentration of about $1 \times 10^{18}$ acceptors/cm$^3$.

While the present invention has been illustrated by a description of various preferred embodiments and while these embodiments have been described in considerable detail in order to describe the best mode of practicing the invention, it is not the intention of applicants to restrict or in any way limit the scope of the appended claims to such detail. Additional advantages and modifications within the spirit and scope of the invention will readily appear to those skilled in the art. The invention itself should only be defined by the appended claims, wherein.

We claim:

1. A semiconductor structure comprising:
    a zinc oxide substrate; and
    a zinc oxide layer formed on said zinc oxide substrate, said zinc oxide layer including an atomic concentration of a p-type dopant and an atomic concentration of a compensating dopant sufficient to provide p-type conduction.

2. The semiconductor structure of claim 1 wherein said p-type dopant is selected from the group consisting of nitrogen, phosphorus, arsenic, antimony and bismuth.

3. The semiconductor structure of claim 1 wherein said atomic concentration of said p-type dopant and said atomic concentration of said compensating dopant are sufficient to provide said zinc oxide layer with a carrier density of less than or equal to about $\times 10^{18}$ acceptors/cm$^3$ and a carrier mobility of less than about 10 cm$^2$/(V·sec).

4. The semiconductor structure of claim 1 wherein said compensating dopant is selected from the group consisting of lithium, sodium, potassium, and rubidium.

5. The semiconductor structure of claim 1 wherein said compensating dopant in said zinc oxide layer is provided by thermal diffusion from said zinc oxide substrate.

6. The semiconductor structure of claim 1 wherein said zinc oxide layer is, formed in a molecular beam epitaxy system and said atomic concentration of said compensating element in said zinc oxide layer is provided by a molecular flux generated within said molecular beam epitaxy system.

7. The semiconductor structure of claim 1 wherein said zinc oxide layer and said zinc oxide substrate have a coextensive interface, said interface being substantially free of strain.

8. A semiconductor structure comprising:
    a zinc oxide substrate;
    a buffer layer of zinc oxide formed on said zinc oxide substrate; and
    a zinc oxide layer formed on said zinc oxide buffer layer, said zinc oxide layer including a first atomic concentration of a p-type dopant and a first atomic concentration of a compensating dopant sufficient to provide p-type conduction.

9. The semiconductor structure of claim 8 wherein said buffer layer includes an atomic concentration of an n-type dopant selected from the group consisting of boron, aluminum, gallium, indium, thallium, fluorine, chlorine, bromine and iodine.

10. The semiconductor structure of claim 8 wherein said buffer layer includes a second atomic concentration of a p-type dopant selected from the group consisting of nitrogen, phosphorus, arsenic, antimony and bismuth.

11. The semiconductor structure of claim 10 wherein said buffer layer includes a second atomic concentration of a compensating dopant selected from the group consisting of lithium, sodium, potassium, and rubidium.

12. A semiconductor structure comprising:

a zinc oxide substrate;

a first zinc oxide layer formed on said zinc oxide substrate, said first zinc oxide layer including an atomic concentration of a p-type dopant and an atomic concentration of a compensating dopant sufficient to provide p-type conduction; and a second zinc oxide layer formed on said first zinc oxide layer, said second zinc oxide layer including an atomic concentration of an n-type dopant sufficient for providing n-type conduction.

13. The semiconductor structure of claim 12 wherein said n-type dopant is selected from the group consisting of boron, aluminum, gallium, indium, thallium, fluorine, chlorine, bromine and iodine.

14. A semiconductor structure comprising:

a zinc oxide substrate;

a first zinc oxide layer formed on said zinc oxide substrate, said first zinc oxide layer including a first atomic concentration of a p-type dopant sufficient to provide p-type conduction; and a second zinc oxide layer formed on said first zinc oxide layer, said second zinc oxide layer including a second atomic concentration of a p-type dopant sufficient for providing p-type conduction, said second atomic concentration differing from said first atomic concentration.

15. The semiconductor structure of claim 14 wherein said p-type dopant in said first zinc oxide layer and said p-type dopant in said second zinc oxide layer are each selected from the group consisting of nitrogen, phosphorus, arsenic, antimony and bismuth.

16. The semiconductor structure of claim 15 wherein at least one of said first zinc oxide layer and said second zinc oxide layers includes an atomic concentration of a compensating element.

17. The semiconductor structure of claim 16 wherein said compensating dopant is selected from the group consisting of lithium, sodium, potassium, and rubidium.

18. A semiconductor structure comprising:

a zinc oxide substrate; and first and second zinc oxide layers formed on said zinc oxide substrate, at least one of said first and second zinc oxide layer including an atomic concentration of a p-type dopant sufficient to provide p-type conduction, and at least one of said first and second zinc oxide layers including an atomic concentration of a compensating element.

19. The semiconductor structure of claim 18 wherein said compensating dopant is selected from the group consisting of lithium, sodium, potassium, and rubidium.

20. A semiconductor structure comprising:

a single-crystal zinc oxide substrate; and a zinc oxide layer formed epitaxially on said zinc oxide substrate, said zinc oxide layer including a first atomic concentration of a p-type dopant and a second atomic concentration of a compensating dopant operative to electronically compensate for excess donors in said zinc oxide layer, said zinc oxide layer exhibiting p-type conduction.

21. The semiconductor structure of claim 20 wherein said compensating dopant is selected from the group consisting of lithium, sodium, potassium, and rubidium.

22. The semiconductor structure of claim 20 wherein said p-type dopant is selected from the group consisting of nitrogen, phosphorus, arsenic, antimony and bismuth.

23. The semiconductor structure of claim 20 wherein a carrier density of said zinc oxide layer is less than about $1 \times 10^{18}$ acceptors/cm$^3$ and a carrier mobility of said zinc oxide layer is less than about 10 cm$^2$/(V·sec).

24. The semiconductor structure of claim 20 wherein said compensating dopant in said zinc oxide layer is provided by thermal diffusion from said zinc oxide substrate.

25. The semiconductor structure of claim 20 wherein said zinc oxide layer is formed in a molecular beam epitaxy system and said compensating dopant in said zinc oxide layer is provided by a molecular flux generated within said molecular beam epitaxy system.

26. The semiconductor structure of claim 20 wherein said zinc oxide layer and said zinc oxide substrate have a coextensive interface, said interface being substantially free of strain.

* * * * *